United States Patent [19]

Carlson

[11] Patent Number: 4,490,626
[45] Date of Patent: Dec. 25, 1984

[54] MULTIPLEXER CIRCUITRY FOR HIGH DENSITY ANALOG SIGNALS

[75] Inventor: Randolph S. Carlson, Irvine, Calif.

[73] Assignee: Irvine Sensors Corporation, Costa Mesa, Calif.

[21] Appl. No.: 403,004

[22] Filed: Jul. 29, 1982

[51] Int. Cl.³ .......................................... H03K 17/687
[52] U.S. Cl. .................................. 307/243; 307/583; 307/585; 328/154; 370/58
[58] Field of Search .............. 307/444, 463, 468, 469, 307/490, 491, 498, 500, 501, 585, 584, 583, 242, 243; 328/104, 109, 154; 370/58

[56] References Cited

U.S. PATENT DOCUMENTS

| | | | |
|---|---|---|---|
| 3,601,634 | 8/1971 | Ebertin | 307/583 |
| 3,621,288 | 11/1971 | Brown | 307/243 |
| 3,638,131 | 1/1972 | Sarkissian | 307/243 X |
| 3,902,127 | 8/1975 | Wilson | 307/498 X |
| 3,904,977 | 9/1975 | Barsotti | 307/243 X |
| 4,349,750 | 9/1982 | Geurts | 307/243 |

*Primary Examiner*—Larry N. Anagnos
*Assistant Examiner*—David R. Bertelson
*Attorney, Agent, or Firm*—Thomas J. Plante

[57] ABSTRACT

A multiplexer circuit is disclosed, for use with such signal sources as focal plane detector arrays, which contains a large number of parallel branches, each of which includes a transconductance MOSFET amplifier and a MOSFET switch of opposite channel polarity from the amplifier. The amplifier in each branch receives high impedance voltage signals originating from its individual detector and converts them with high power gain into current signals which feed into the common output line whenever the switch in the same branch is turned on. The multiplexer branches, together with the multiplexer control logic, and other electronic devices, are all included on a signal IC chip which provides CMOS logic.

20 Claims, 5 Drawing Figures

MULTIPLEXER CIRCUITRY FOR HIGH DENSITY ANALOG SIGNALS

BACKGROUND OF THE INVENTION

This invention relates to multiplexing circuitry which can handle very high densities of high impedance inputs.

The particular problems addressed by this invention have been encountered in handling the analog signals from arrays of very small infrared detectors located on a focal plane. The manufacture of such focal plane detector arrays is discussed in various patents and applications assigned to the assignee of this application, including U.S. Pat. Nos. 4,290,844 (issued Sept. 22, 1981), and 4,304,624 (issued Dec. 8, 1981), and application Ser. No. 282,459 (filed July 13, 1981).

In order to convey each detector signal individually to the processing electronics, multiplexing circuitry adjacent to the focal plane is necessary. Such multiplexing circuitry should be (a) able to handle high impedance inputs, (b) low in noise, (c) free of substantial cross-talk, (d) capable of very low temperature operation, (e) capable of very quick settling time, and (f) confined to the dimensional limitations of integrated circuits.

While the present invention was motivated by the needs in the field of high-density infrared detector arrays, its principles may be applied in other fields where similar problems occur.

Because of the low temperature environment needed by infrared detectors, the electronics used at the focal plane are limited to those elements capable of operating under such low temperature conditions, e.g., 30° Kelvin–150° Kelvin.

Heretofore, the primary efforts to solve the problems addressed by this invention have involved the use of charge coupled devices (CCDs). Multiplexers using CCDs have, however, encountered serious difficulties. In experimental applications, such multiplexers have suffered from marginal noise performance, and their dynamic range is relatively low for the needs addressed in the present disclosure.

Other multiplexer circuit designs (not using CCDs) have been tried, which have had high power dissipation because the signals awaiting their turn in the multiplexer have constituted a power drain.

Another problem in multiplexers of the type under consideration has been excessive cross-talk among the varying voltages which exist on different paths in extremely confined space.

The present invention is intended to solve the problems outlined above, and generally to provide a multiplexer which has greatly improved overall performance, together with a potential reduction in cost.

STATEMENT OF THE INVENTION

The present invention provides separate high power gain amplification for the analog signal from each detector in a multiplexed series, while substantially eliminating power dissipation when the signal from that detector is waiting to be connected to the multiplexed output. In other words, switching means are provided which turn each amplifier off and on, and which prevent power dissipation when the amplifier is turned off. In a sense, each switching means serves the dual purpose of sequencing its amplifier in the multiplexer and of cutting off power in its amplifier when the multiplexer output is disconnected from that amplifier.

Another important concept is the use of an amplifier "dedicated" to each detector, which amplifier inputs the voltage analog signal from the detector, and outputs a current analog signal to the multiplexer common output line. This use of current signals in, and beyond, the multiplexer, largely eliminates cross-talk problems. It also permits higher speed operations due to shortened settling time. The current signal may be subsequently converted to an output voltage signal.

A preferred structure is an integrated circuit chip incorporating CMOS technology, and providing both the sequencing control circuitry (logic) of the multiplexer and the amplification-and-switching circuitry of each branch associated with the analog signal output of its respective detector. The CMOS chip makes available both N-channel and P-channel transistors, which permits overall reduced power dissipation.

DETAILED DESCRIPTION OF PREFERRED EMBODIMENTS

As stated above, the use which motivated the present invention is the detector array focal plane structure in which a multiplicity of detectors provide individual voltage signals which are sequentially transmitted to off-focal plane electronics for analysis and interpretation. A preferred version of such a detector array focal plane structure is disclosed in Carson and Clark U.S. patent application Ser. No. 282,459, filed July 13, 1981 and assigned to the assignee of the present application. In Ser. No. 282,459, the detectors are mounted on a focal plane which is provided by the edges of a stack of chips, each of which is in a plane perpendicular to the focal plane, and each of which carries integrated circuitry for the purpose of accomplishing the maximum number of electronic functions immediately adjacent to the focal plane. This involves the inclusion of individual filtering circuitry for each detector on the chip, plus multiplexing circuitry to minimize the number of lines leading from the chip, which is considered to be "on-focal plane", to the "off-focal plane" electronics.

Figure 1:
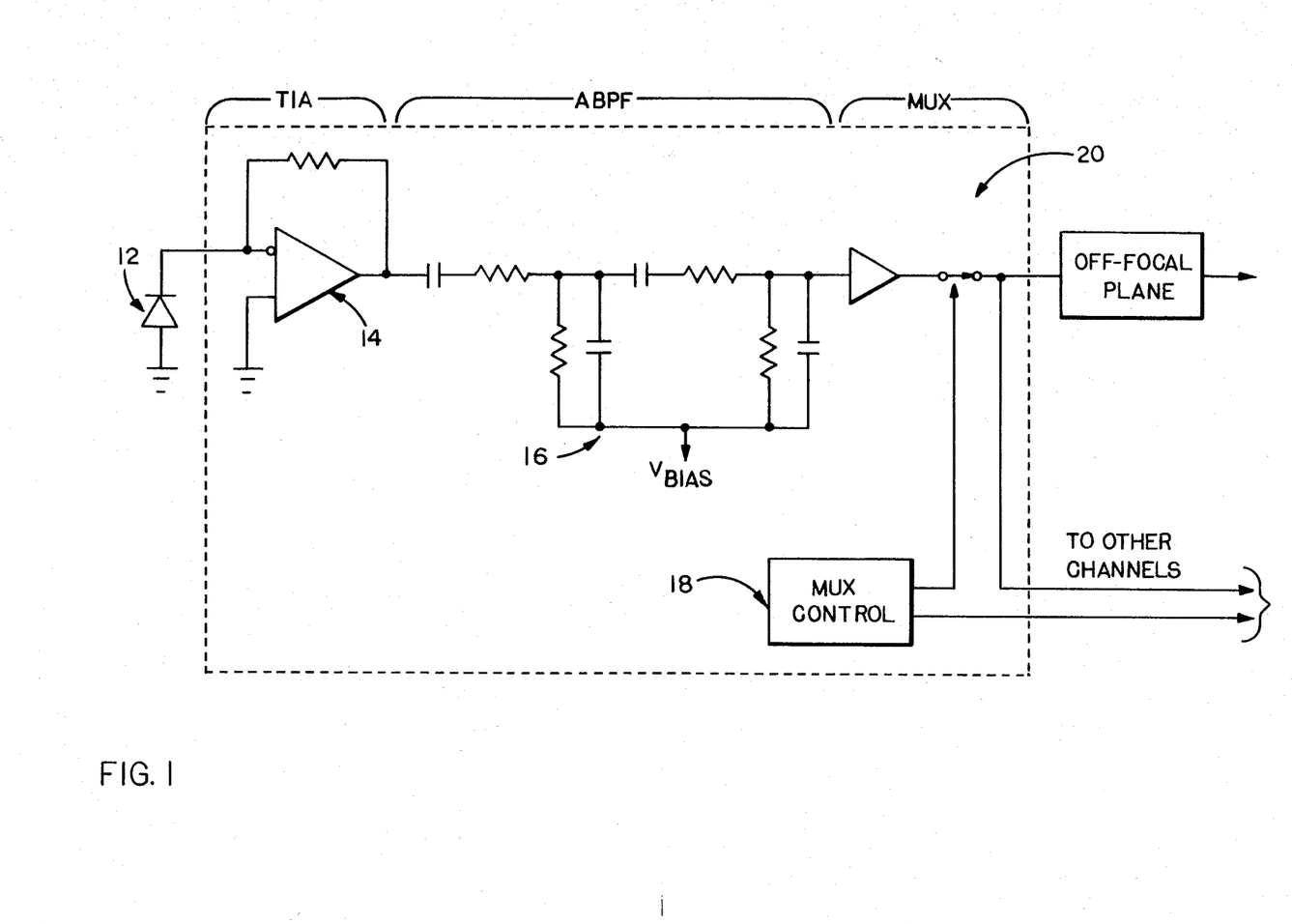
FIG. 1 is a block diagram showing a detector-array environment in which the multiplexer of the present invention is incorporated as part of the on-focal plane electronics.

FIG. 1 of the present application shows the electronics which are to be mounted on a single chip, the dashed lines surrounding the integrated circuitry (IC) on each chip. A single staring sensor detector is shown at 12, which is one of many such detectors sending its analog signals to the same chip. The common ground connections of the detectors may, for example, be provided by a common grid of the type disclosed in U.S. Pat. No. 4,290,844 (see 58 in FIG. 11), issued Sept. 22, 1981 and also assigned to the assignee of this application.

The IC on each chip may comprise three general component areas: a plurality of amplifiers 14, one for each detector, a plurality of filters 16, one for each detector, and a parallel input-serial output multiplexer which includes an on-chip multiplexer control 18 and a plurality of separate multiplexer branches 20, one branch for each detector. The present invention is primarily concerned with the multiplexer branches 20 and their control 18.

One of the parameters which creates limitations on the multiplexer structure is the need, in most cases, for the inclusion in the on-chip IC of an amplifier 14 and filter 16 for each detector. Each amplifier 14, which is preferably an insulated gate field effect transistor, is needed to buffer its detector signal and immediately raise the voltage of the very low level detector signal, thereby reducing noise problems. Each filter 16 is preferably an adaptive bandpass filter which limits the noise bandwidth, and defines the frequency response.

Figure 2:
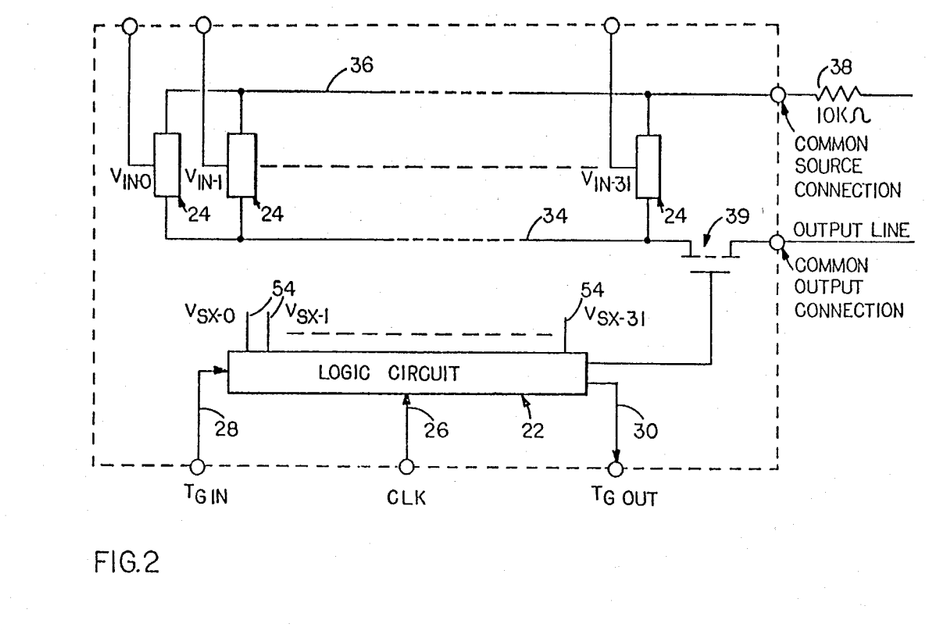
FIG. 2 is a diagram of one version of the improved multiplexer of the present invention, showing the relationship of the logic circuitry to the multiplexer branches.

FIG. 2 shows the general arrangement of the multiplexer portion of the IC electronics on each chip, which is the heart of the present invention. The multiplexer comprises a logic circuit 22 (which corresponds to the multiplexer control 18 in FIG. 1), and a plurality of branches 24 (corresponding to the branches 20 in FIG. 1), each connected to a separate detector (and its amplifier 14 and filter 16).

The preferred transistor elements for the logic circuit 22 are complementary metal-oxide field effect transistors (CMOS), although other types of insulated gate field effect transistors should be adaptable for use in the circuit. CMOS logic provides significant benefits, because it has the characteristic of latching without dissipating power, i.e., it only dissipates power while changing states. NMOS or PMOS circuitry would lack memory capabilities unless power were used for latching. Minimizing the use of power is obviously desirable, but it is particularly important in situations where cryogenic temperatures are maintained. In order to obtain maximum sensitivity of the detectors in resolving images, it is desirable to locate the focal plane detector array in a Dewar container which is maintained at the desired low temperatures. Providing energy for cooling purposes would be much more difficult if substantial amounts of power had to be dissipated in the circuitry.

The low temperature requirements essentially limit the choice of transistors to field effect transistors, and CMOS provide the complementary feature which has proved extremely valuable in detector array multiplexers.

The logic circuit of FIG. 2 requires only three external logic lines (in addition to power supply lines): clock line 26, trigger input line 28, and trigger output line 30. This constitutes the minimum number of external control connections. However, there is a trade off involved, because minimizing the number of external control lines does sacrifice the possibility of random accessing. This subject will be discussed in more detail below.

As shown in FIG. 2, there are 32 (N=31) of the multiplexer branches 24, each connected to a separate detector (and its individual amplifier 14 and filter 16). The number 32 is arbitrary. (For example, one present design of on-chip ICs has 128 detector lines on each chip.) The 32 branches share a common output line 34. They also share a common voltage source connection, line 36, which preferably includes a resistor 38 (the value shown is 10 KΩ) which serves the purpose of limiting the variations which would otherwise result from unavoidable differences among the transistors in the 32 multiplexer branches. The circuitry of FIG. 2 also includes, in its output line 34, a MOSFET switch 39, the purpose of which will be explained below.

Figure 3:
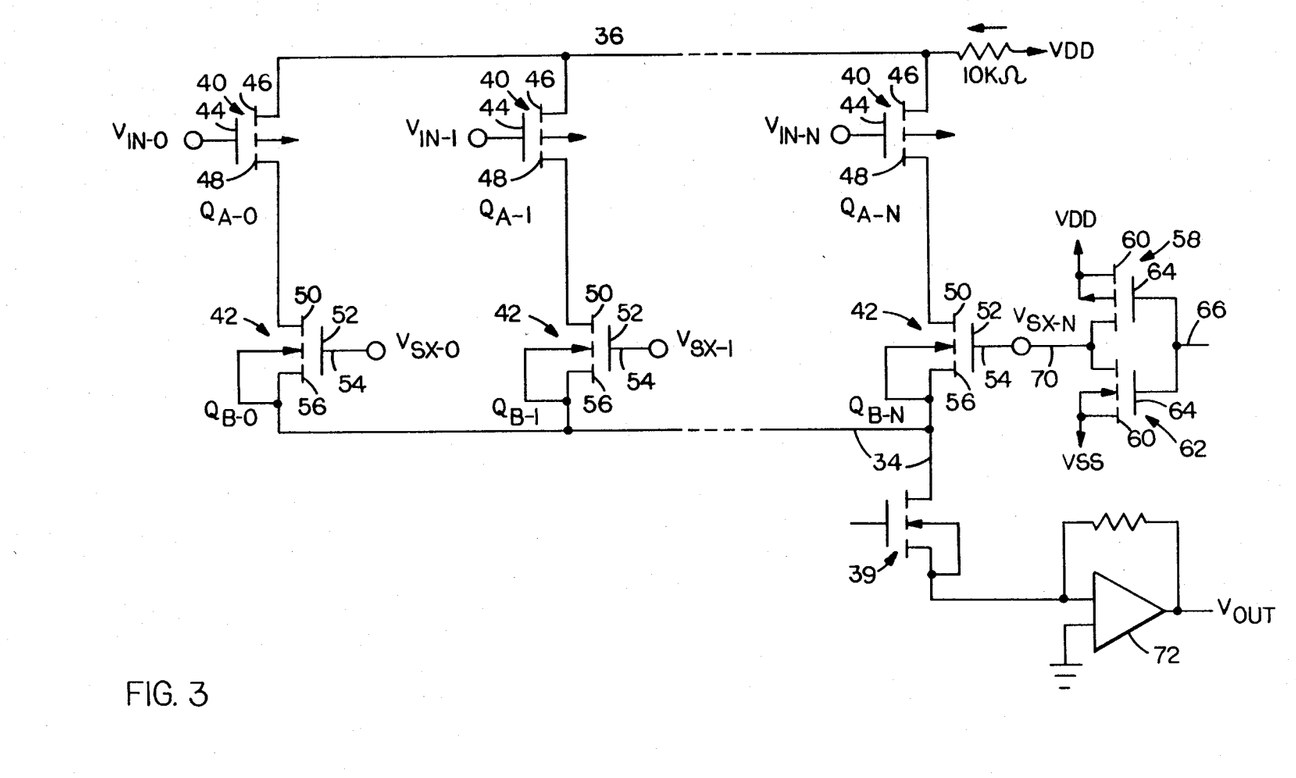
FIG. 3 is a schematic of the multiplexer branches, each of which incorporates two field effect transistors.

FIG. 3 shows the separate multiplexer branches, each of which contains two insulated gate field effect transistors, which are preferably MOSFETs. The MOSFET 40 in each branch is an amplifier of the analog signal from its respective detector. The MOSFET 42 in each branch is a switch which, when turned on, connects the MOSFET 40 in the same branch to the multiplexer output line 34.

Each MOSFET 40 receives at its gate 44 the analog voltage signal originating from its respective detector. Significantly, its output analog signal is the source-to-drain current flow, which varies proportionally to the input voltage, the source 46 of each MOSFET 40 being connected to the common source voltage by line 36, and the drain 48 of each MOSFET 40 being connected to the drain 50 of the respective switch MOSFET 42.

Each switch MOSFET 42 has its gate 52 connected to its respective line 54 from logic circuit 22 (note FIG. 2); and its source 56 connected to the common multiplexer output line 34. Under the control of the logic circuit 22, the switch MOSFETs 42 are normally turned off, allowing no current flow through the respective amplifier MOSFETs 40. When a "trigger in" signal is received by logic circuit 22, it first sends a voltage signal on the line 54 designated $V_{SX-0}$, causing the switch MOSFET 42 designated $Q_{B-0}$ to turn on. A current analog output signal is thereupon permitted to flow in the amplifier 40 designated $Q_{A-0}$, which signal is proportional to, but amplified to a much higher power than, the input signal designated $V_{IN-0}$; and the amplified current output signal from $Q_{A-0}$ is transmitted through switch $Q_{B-0}$ to the multiplexer output line 34.

The logic circuit 22 then turns off the signal on line $V_{SX-0}$, and sends a voltage signal on the next line designated $V_{SX-1}$ to turn on the next switch 42 designated $Q_{B-1}$. This permits an amplified analog current signal to flow in the amplifier 40 designated $Q_{A-1}$, in the same branch as switch $Q_{B-1}$; and permits that signal to pass to the multiplexer output line 34. This process is continued until all 32 detector-amplifier combinations have sent their output signals seriatim to the output line.

Each switch 42 may be controlled by a typical CMOS switch in the logic system, one of which is shown at the right side of FIG. 3 connected to $V_{SX-N}$. Each CMOS switch comprises a P-channel MOSFET 58 having its source 60 connected to $V_{DD}$, and an N-channel MOSFET 62 having its source 60 connected to $V_{SS}$. (Values of the source voltages may be approximately 5 V at $V_{DD}$ and approximately 0 V at $V_{SS}$.) The gates 64 of the respective MOSFETs 58 and 62 are both connected to the logic circuitry by line 66; and the drains 68 of the respective MOSFETs 58 and 62 are both connected by line 70 to the gate 52 of one of the switch MOSFETs 42 (in the figure, line 70 is shown providing signal $V_{SX-N}$ to switch $Q_{B-N}$). In the illustrated logic system, a positive signal is required at gate 52 of switch device 42 to turn on the switch. To accomplish this, a negative signal is required on line 66, which turns on the P-channel MOSFET 58 and turns off the N-channel MOSFET 62, thereby providing a positive output signal on line 70.

Since it is necessary for source-to-drain current in each amplifier 40 to flow during the full turned-on period of its switch 42, a voltage bias is necessary on each gate 44. If we assume a $V_{DD}$ voltage of approximately 5 V and a desired branch current flow of approximately 0.1 mA, the bias voltage on the gates 44 should be in the range of 2–3 V (the CMOS devices are operating in the enhancement mode).

The voltage of the output line 34 should be several volts more negative than the common source line 36, because it is very desirable to have the amplifier MOSFET 40 operate in the region where its drain current is essentially unaffected by voltage variations in the output line 34.

The amplifier/switch combination in each branch of the multiplexer is extremely effective. Because current flows in each amplifier transistor 40 only while the switch transistor 42 in its branch is turned on, total power dissipation is very low, even though relatively high power output signals are transmitted.

Furthermore, because the amplifiers 40 provide output signals as current variations, rather than voltage variations, cross-talk between signals from multiple multiplexer chips is substantially eliminated because the capacitive effect of varying output voltages is not present. Because the output line is always at a constant potential, the possibility of cross-talk between that line and any adjacent line is greatly reduced. The current analog signals are converted into voltage output signals downstream by a suitable off-focal plane wide-band amplifier 72.

Also, the use of current analog output signals substantially reduces settling time, which permits more rapid transmission of signals from successive detectors. This benefit occurs because the effect on output settling time of parasitic capacitance between the output line and either ground or the adjacent signals is effectively reduced by the loop gain of the amplifier 72, which can easily be made very large. Such an amplifier functions to maintain the output line 34 at a substantially constant voltage.

The MOSFET amplifier devices 40 used in the transconductance mode have the highly desirable characteristics of high impedance input receiving the high impedance filtered signals from the detector, combined with large power gain output.

As shown in FIG. 3, the amplifier device 40 in each branch is a PMOS transistor, whereas the switch device 42 in each branch is an NMOS transistor. This is considered the preferred arrangement, although their roles could be reversed, or both transistors could have the same polarity. The P-channel amplifier is less noisy than an N-channel amplifier would be, but the N-channel would have higher gain and better linearity if it were used as the amplifying device.

Using an N-channel device as the switch, in combination with the P-channel amplifier, has the advantage that a much lower voltage swing is needed to turn the switch on and off than would be the case if the switch device had the same channel polarity as the amplifier device. This advantage provides a significant saving in power required to operate the switch device.

The switch device 42 in each branch preferably has as its input the output of the amplifier device 40, although their positions could be reversed. However, the arrangement shown has the important advantage of reduced noise voltage.

Each switch device 42 may be thought of as performing a dual function: (a) it connects and disconnects its branch from the logic circuit and output line, and (b) it turns on and off the amplifier in its branch. Because of the latter function, power is used by each amplifier device only when its branch is connected to the output line. In other words, the input to gate 44 on each amplifier device 40 is an analog signal, whereas amplifier 40 is turned on and off by the input to gate 52 of the other device in the branch, transistor 42.

The MOSFET switch 39, which is shown in FIGS. 2 and 3, has an important function where first and second order multiplexers are combined, i.e., where a substantial number of separate signals are multiplexed, as shown in those figures, and then the outputs of those multiplexers are themselves sequenced with other multiplexers, which may be on separate IC chips. In such a situation, the capacitive coupling of power supply noise from parasitic capacitances of the switches 42 would be deleterious, unless the effects of such coupling were isolated from the final output line. Switch 39, under the control of logic circuit 22, isolates the chip shown in that figure from other multiplexer chips in the same group, after the signals from the illustrated multiplexer have been transmitted to the output line.

The sequencing of the multiplexers may be accomplished either with a "daisy chain" arrangement, if the minimum number of chip access lines is desired, or with a random access logic system, if it is desired to permit programming the order of data "read out" for such purposes as analysis of the spectral signature of the detector signals.

Figure 4:
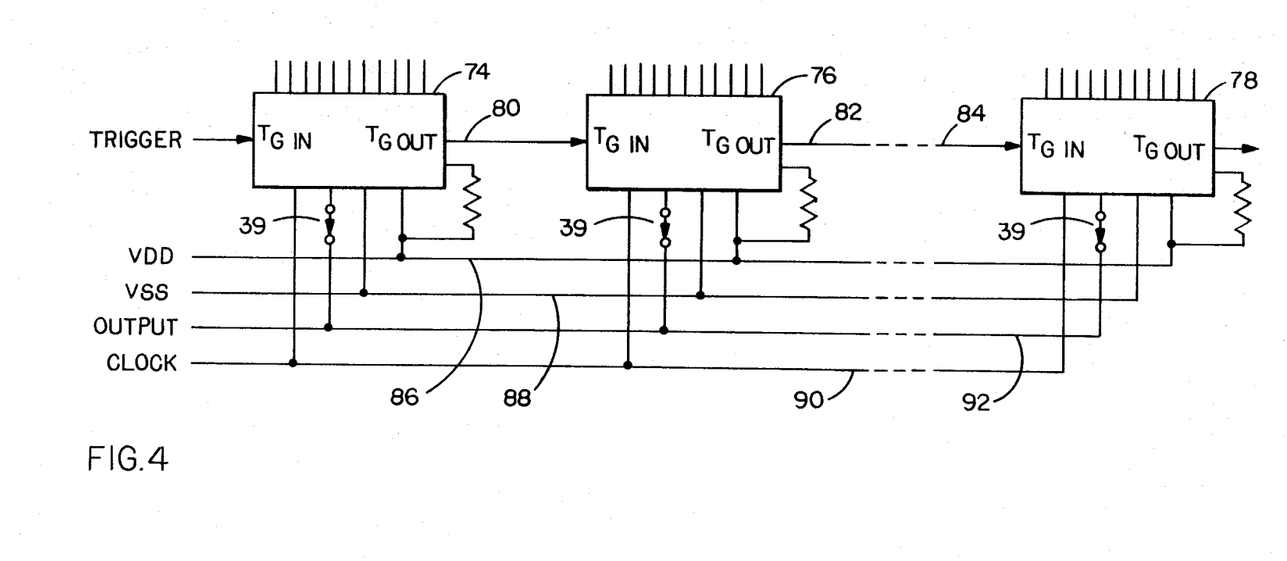
FIG. 4 is a block diagram showing a series of multiplexers connected in a "daisy chain" sequence for minimization of access lines.

FIG. 4 illustrates the simplicity of a "daisy chain" arrangement, in which a plurality of multiplexer logic circuits—74, 76 and 78—are shown connected in a series, or string. The "trigger out" line 80 from multiplexer 74 is the "trigger in" line to multiplexer 76; the "trigger out" line 82 from multiplexer 76 is the "trigger in" line to the next multiplexer in the series; and the "trigger out" line 84 from the next-to-last multiplexer is the "trigger in" line to the last multiplexer 78. The multiplexers in the string share common source voltage lines 86 and 88, a common clock line 90, and a common output line 92.

The benefit of the series connection of multiplexers shown in FIG. 4 is that it reduces the lines going into (or out of) each chip to the minimum number. The trade-off problem is that a failure in one multiplexer in the string disables all subsequent multiplexers in the string.

Random accessing is generally preferred; and a novel concept for obtaining random accessing of the chips with fewer than normal control lines will be the subject of a separate application, also assigned to the assignee of the present application.

Figure 5:
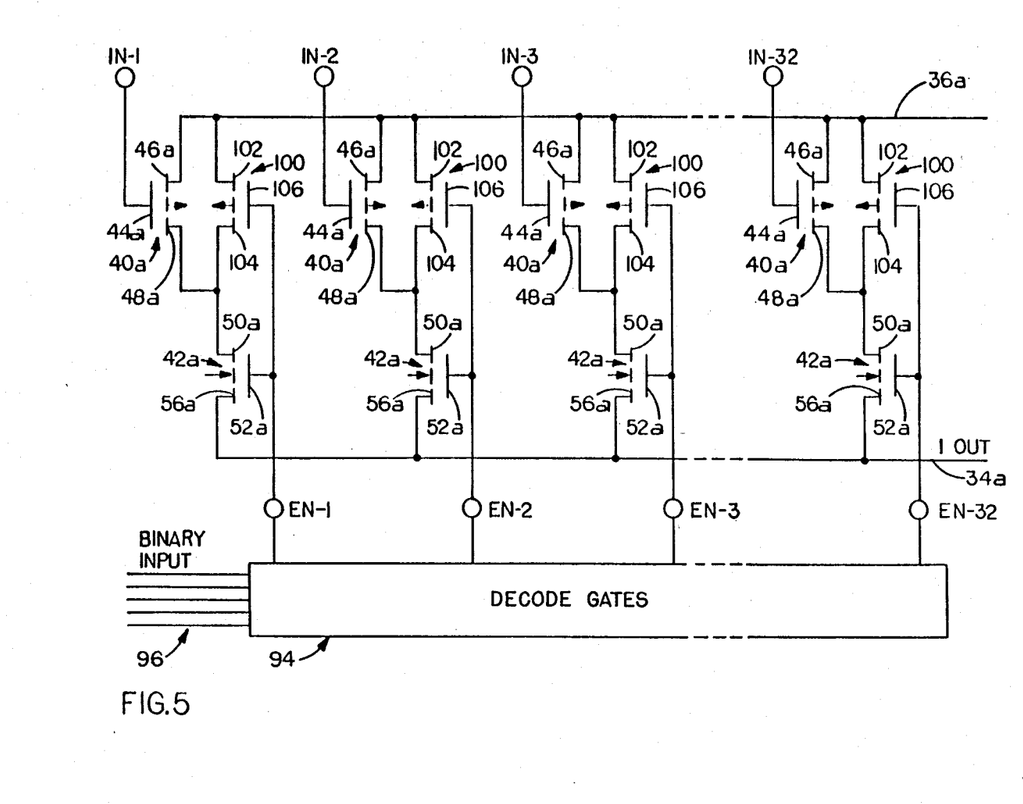
FIG. 5 is a diagram of another version of the improved multiplexer of the present invention, showing the use of logic circuitry which permits random access sequencing within the multiplexer, and also showing schematically multiplexer branches which each include three field effect transistors.

Random accessing of the branches within each multiplexer may be obtained with standard decoding logic, as shown in FIG. 5. Here the decode gates shown by block 94 are addressed by five lines 96, which provide binary input controls for the 32 branches in each multiplexer. If desired, the number of branches in each multiplexer may be increased, requiring one or more additional binary input control lines. For example, seven such binary input control lines will provide random accessing for a multiplexer having 128 branches.

The multiplexer branches shown in FIG. 5 differ from those shown in FIG. 3, in that a third transistor device 100 has been added to each branch for the purpose of decreasing the settling time by rapidy discharging all internal capacitance of the branch.

Each multiplexer branch in FIG. 5 has an amplifier device 40a, which corresponds in structure and function to the amplifier device 40 in FIG. 2; and a switch device 42a, which corresponds in structure and function to the switch device 42 in FIG. 2. Other elements in FIG. 5 which correspond to elements in FIG. 2 also retain the same numerals, with the subscript "a" added.

As shown in FIG. 5, each transistor 100 is a PMOS device, which has its source 102 connected to the source 46a of amplifier 40a, its drain 104 connected to the source 50a of switch 42a, and its gate 106 connected to the gate 52a of switch 42a. Because transistor 100 is a PMOS device, it turns on when the NMOS switch 42a turns off, due to the common connection of the gates 52a and 106 of the two devices. Thus rapid discharge of the internal capacitance of the branch occurs as soon as the branch is turned off by the logic circuit.

From the foregoing description, it will be apparent that the devices disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A multiplexer, for use with an array of independent analog voltage signal sources, comprising:
   a plurality of separate signal-carrying branches, each having an input from a different analog voltage signal source, and all connected to a common output line, said branches being coupled in parallel between a reference terminal and the common output line;
   each branch including an amplifier which causes a high power gain of its analog voltage input when enabled, but which has substantially no power dissipation when disabled, and a respective actuating means for enabling or disabling the individual branch;
   the amplifier in each branch being an insulated gate field effect transistor which receives the voltage input signal on its gate and outputs an analog signal as its source-to-drain current when its respective branch is enabled by its actuating means; and
   sequencing means for causing each actuating means to enable its respective branch only when all the others in the multiplexer are disabled.

2. The multiplexer of claim 1 wherein the actuating means in each branch is an insulated gate field effect transistor which has substantially no power dissipation when it disables the respective branch.

3. The multiplexer of claim 1 wherein the amplifier in each branch is a MOSFET element.

4. The multiplexer of claim 3 wherein the actuating means in each branch is a MOSFET element having its source-to-drain current path in series with the source-to-drain current path of the amplifier.

5. The multiplexer of claim 4 wherein each branch also includes a third MOSFET element which has its source-to-drain current path connected in parallel with the source-to-drain current path of the amplifier MOSFET element and which is enabled when the actuating MOSFET element is disabled, thereby causing rapid discharge of internal capacitance of the branch.

6. The multiplexer of claim 4 wherein one of the MOSFET elements in series in each branch is a P-channel transistor and the other is an N-channel transistor.

7. The multiplexer of claim 6 wherein the P-channel transistor is the amplifier and the N-channel transistor is the actuating means.

8. A multiplexer having logic sequencing circuitry and a plurality of parallel branches, coupled between a reference terminal and a common output line, which receive separate voltage input signals, each branch comprising:
   a first electronic device which functions as a power amplifier, having as its input a voltage signal and as its output a current signal; and
   a second electronic device which functions as a switch in series with the first electronic device, connected between the reference terminal and the common output line and having as its input a signal from the logic sequencing circuitry, and arranged when enabled to permit current to flow in the first electronic device, but when disabled to prevent current from flowing in the first electronic device.

9. The multiplexer of claim 8 wherein the first and second electronic devices are MOSFETs.

10. The multiplexer of claim 9 wherein one of the MOSFETs is a P-channel device and the other is an N-channel device.

11. The multiplexer of claim 10 wherein the P-channel device functions as the power amplifier, and the N-channel device functions as the switch.

12. The multiplexer of any one of claims 8 through 11 wherein the switch device receives the output of the amplifier device.

13. The multiplexer of any one of claims 8 through 11 which also includes a multiplexer-isolating switch controlled by the logic circuitry to cut off all of the parallel branches from the common output line when the multiplexer is not supplying signals to said common output line.

14. The multiplexer of claim 13 wherein the multiplexer-isolating switch is a MOSFET device.

15. A multiplexer having parallel inputs and a series output, for use with an array of minute sensors arranged to transmit independent signals, comprising an integrated circuit chip which includes:
   a plurality of parallel branches coupled between a reference terminal and a common output line, each receiving an input signal from a different sensor;
   logic circuitry which causes the branches to be sequentially connected to, and disconnected from, the multiplexer output;
   each branch including a first transistor which amplifies the input signal originated by the respective sensor, and a second transistor which enables and disables the branch under the control of the logic circuitry;
   the first transistor in each branch being a MOSFET which receives the input signal at its gate as an analog voltage signal, and outputs an analog current signal as its source-to-drain current.

16. The multiplexer of claim 15 in which the second transistor is a MOSFET which is enabled and disabled by logic circuit control signals at its gate, and which permits current from the first transistor to pass through to the output line only when it is enabled.

17. A multiplexer, for use with an array of independent analog voltage signal sources, comprising:
a plurality of separate signal-carrying branches, each having an input from a different analog voltage signal source, and all connected in parallel between a reference terminal and a common output line;
each branch including (a) an amplifying transistor which causes a high power gain of its analog voltage input when enabled, but which has substantially no power dissipation when disabled, and (b) a transistor switch which enables and disables the transistor amplifier and which has substantially no power dissipation except when its branch is enabled, the amplifying transistor having its conducting path in series with the conducting path of the transistor switch; and
sequencing means for enabling each transistor switch only when all the others in the multiplexer are disabled.

18. The multiplexer of claim 17 wherein the transistor amplifiers and transistor switches are MOSFET devices.

19. The multiplexer of claim 18 wherein the incoming analog voltage signal is at the gate of the MOSFET amplifier, and the sequencing means provides a signal at the gate of the MOSFET switch.

20. The multiplexer of claim 19 in which, when the MOSFET switch is enabled, the source-to-drain current flows in series through the amplifier and switch transistors between the reference terminal and the output line of the chosen branch; and when the MOSFET switch is disabled, the source-to-drain current does not flow in either transistor.

* * * * *